United States Patent
Fujikawa

(10) Patent No.: US 10,844,517 B2
(45) Date of Patent: Nov. 24, 2020

(54) METHOD OF PROCESSING SIC SINGLE CRYSTAL AND METHOD OF MANUFACTURING SIC INGOT

(71) Applicant: SHOWA DENKO K.K., Tokyo (JP)

(72) Inventor: Yohei Fujikawa, Hikone (JP)

(73) Assignee: SHOWA DENKO K.K., Tokyo (JP)

( * ) Notice: Subject to any disclaimer, the term of this patent is extended or adjusted under 35 U.S.C. 154(b) by 144 days.

(21) Appl. No.: 16/225,848

(22) Filed: Dec. 19, 2018

(65) Prior Publication Data

US 2019/0194824 A1 Jun. 27, 2019

(30) Foreign Application Priority Data

Dec. 22, 2017 (JP) ................. 2017-246943

(51) Int. Cl.
| | | |
|---|---|---|
| *C30B 23/02* | (2006.01) | |
| *C30B 29/36* | (2006.01) | |
| *C30B 29/66* | (2006.01) | |
| *C30B 29/60* | (2006.01) | |
| *C30B 23/00* | (2006.01) | |
| *H01L 21/02* | (2006.01) | |

(52) U.S. Cl.
CPC ............ *C30B 29/36* (2013.01); *C30B 23/002* (2013.01); *C30B 23/02* (2013.01); *C30B 29/605* (2013.01); *C30B 29/66* (2013.01); *H01L 21/02378* (2013.01); *H01L 21/02433* (2013.01)

(58) Field of Classification Search
CPC ..... C30B 23/00; C30B 23/002; C30B 23/025; C30B 29/36
See application file for complete search history.

(56) References Cited

U.S. PATENT DOCUMENTS

| 10,031,089 B2 | 7/2018 | Kojima et al. |
| 2016/0231256 A1* | 8/2016 | Kojima ............... C30B 23/00 |
| 2016/0300910 A1* | 10/2016 | Kudou ............... H01L 29/1608 |
| 2017/0263810 A1 | 9/2017 | Imai et al. |

FOREIGN PATENT DOCUMENTS

| CN | 107002284 A | 8/2017 |
| JP | 2009-102187 A | 5/2009 |
| JP | 5398492 B2 | 1/2014 |
| WO | 2015/040895 A1 | 8/1920 |

OTHER PUBLICATIONS

Communication dated Aug. 7, 2020 from the State Intellectual Property Office of the P.R.C. in Application No. 201811532230.7.

* cited by examiner

*Primary Examiner* — Robert M Kunemund
(74) *Attorney, Agent, or Firm* — Sughrue Mion, PLLC

(57) ABSTRACT

A method of processing a SiC single crystal includes a measuring step of measuring a shape of an atomic arrangement plane of the SiC single crystal along at least a first direction passing through a center in plan view and a second direction orthogonal to the first direction; and a surface processing step of processing a first plane serving as an attachment plane of the SiC single crystal, in which the surface processing step includes a grinding step of grinding the first plane, and in the grinding step, a difference is given to a surface state between the first plane and a second plane facing the first plane, and the atomic arrangement plane is flattened by Twyman's effect.

20 Claims, 11 Drawing Sheets

METHOD OF PROCESSING SIC SINGLE CRYSTAL AND METHOD OF MANUFACTURING SIC INGOT

BACKGROUND OF THE INVENTION

Field of the Invention

The present invention relates to a method of processing a SiC single crystal and a method of manufacturing a SiC ingot.

Priority is claimed on Japanese Patent Application No. 2017-246943, filed on Dec. 22, 2017, the content of which is incorporated herein by reference.

Description of Related Art

In silicon carbide (SiC), dielectric breakdown electric field is larger by one order of magnitude, and a band gap is three times larger than silicon (Si). In addition, the silicon carbide (SiC) has properties such as thermal conductivity which is about three times higher than silicon (Si). The silicon carbide (SiC) is expected to be applied to a power device, a high frequency device, a high temperature operation device, or the like.

For devices such as semiconductors, a SiC epitaxial wafer on which an epitaxial film is formed on a SiC wafers is used. An epitaxial film provided on the SiC wafer by a chemical vapor deposition (CVD) method is an active region of a SiC semiconductor device.

For this reason, there is no breakage such as cracks, high quality SiC wafers with few defects are required. In this specification, the SiC epitaxial wafer means a wafer after formation of the epitaxial film, and the SiC wafer means a wafer before the epitaxial film is formed.

For example, in Japanese Patent No.5398492 and Japanese Unexamined Patent Application, First Publication No. 2009-102187, warp and undulation of an outer shape of a SiC single crystal used as a seed crystal are caused by cracks and defects. Japanese Patent No.5398492 discloses that the stress applied to the SiC single crystal of the wafer is reduced by making a coefficient of linear (thermal) expansion of the SiC single crystal and the pedestal within a predetermined range. Japanese Unexamined Patent Application, First Publication No. 2009-102187 discloses that a coefficient of thermal expansion of a seed crystal holding portion is made smaller than that of the other portion of a crucible, so that a stress applied to the SiC single crystal during growth can be reduced.

SUMMARY OF THE INVENTION

Basal plane dislocation (BPD) is one kind of killer defects of the SiC wafer. Some BPDs of the SiC wafer are also taken over by the SiC epitaxial wafer and become a cause of deterioration of forward characteristics when current flows in the forward direction of the device. The BPDs are defects considered to be one of the causes of slip occurring on the basal plane.

As disclosed in Japanese Patent No. 5398492 and Japanese Unexamined Patent Application, First Publication No. 2009-102187, it is difficult to sufficiently suppress the BPD in the SiC wafer even if the stress applied to the SiC single crystal during crystal growth of the outer shape of the SiC single crystal used as the seed crystal is controlled. Therefore, reduction of BPDs are required.

The present invention has been made in view of the above problems, and an object of the present invention is to provide a method of processing a SiC single crystal capable of reducing curvature of an atomic arrangement plane during crystal growth.

As a result of intensive studies, the present inventors have found that there is a correlation between the amount of curvature of the atomic arrangement plane (lattice plane) of the SiC single crystal and the basal plane dislocation (BPD) density. Then, the inventors have found that an attachment plane of the SiC single crystal is subjected to surface processing, and a processing distortion is given to the SiC single crystal, and thereby it is possible to distort the SiC single crystal in a direction opposite to the curving direction of the atomic arrangement plane (the direction in which atomic arrangement plane curves) and flatten the atomic arrangement plane during crystal growth. That is, the present invention provides the following means in order to solve the above-mentioned problems.

That is, a first aspect of the present invention is the following method. (1) According to a first aspect of the present invention, there is provided a method of processing a SiC single crystal, the method including a measuring step of measuring a shape of an atomic arrangement plane of a SiC single crystal having a first plane and a second plane along at least a first direction passing through a center in plan view and a second direction orthogonal to the first direction; and a surface processing step of processing the first plane serving as an attachment plane of the SiC single crystal, in which the surface processing step includes a grinding step of grinding the first plane, and wherein in the grinding step, a difference is given to a surface state between the first plane and the second plane facing the first plane, and the atomic arrangement plane is flattened by Twyman's effect.

(2) In the method of processing a SiC single crystal according to the above aspect, in a case where the shape of the atomic arrangement plane is a saddle type, the first plane is ground along a direction in which an amount of curvature of the atomic arrangement plane is small, and in a case where the shape of the atomic arrangement plane is a bowl type, the first plane is concentrically ground.

(3) The surface processing step in the method of processing a SiC single crystal according to the above aspect may include a warp amount adjusting step of adjusting a warp amount of the SiC single crystal, to adjust in warp amount adjusting step, a thickness of the SiC single crystal may be set, and the warp amount of the SiC single crystal.

(4) The surface processing step in the method of processing a SiC single crystal according to the above aspect may include a warp amount adjusting step of adjusting a warp amount of the SiC single crystal, and in warp amount adjusting step, a grit number used for grinding of SiC single crystal may be selected, to adjust the warp amount of the SiC single crystal.

(5) In the method of processing a SiC single crystal according to the above aspect, a radius of curvature of the atomic arrangement plane of the SiC single crystal processed in the surface processing step may be 28 m or more, or a maximum value of an amount of curvature may be 100 μm or less.

(6) According to a second aspect of the present invention, there is provided a method of manufacturing a SiC ingot using a SiC single crystal processed by the method of processing a SiC single crystal according to the above aspect as a seed crystal, the method including a step of attaching the first plane of the SiC single crystal as an attachment plane to a pedestal; and a crystal growth step of performing crystal growth on the SiC single crystal attached to the pedestal as the seed crystal.

(7) In the method of manufacturing a SiC ingot according to the above aspect, a difference in a coefficient of thermal expansion between the pedestal and the SiC single crystal at a crystal growth temperature may be preferably $0.3 \times 10^{-6}/^\circ$C. or less.

When using the SiC single crystal evaluation method according to the above aspect, it is possible to flatten the atomic arrangement plane during crystal growth.

DETAILED DESCRIPTION OF THE INVENTION

Figure 1:
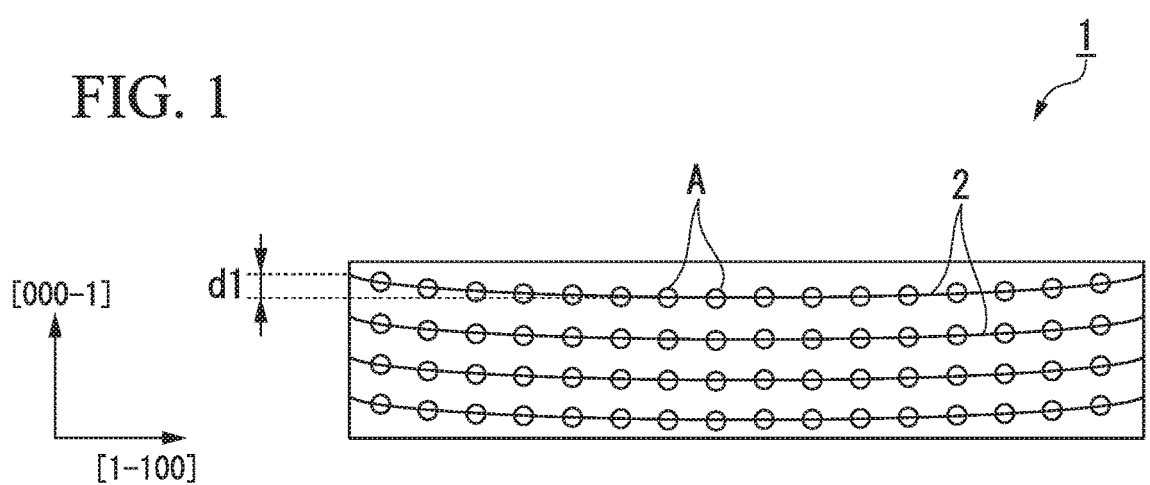
FIG. 1 is a schematic view showing an example of a section plane taken along a straight line extending in a first direction passing through a center in a plan view of a SiC single crystal.

Hereinafter, preferred examples of the present embodiment will be described in detail with reference to the drawings as appropriate. In the drawings used in the following description, for convenience, characteristic portions are sometimes described in an enlarged manner, and sizes, ratios, and the like of the respective components may be different. In addition, materials, sizes, and the like which will be exemplified in the following description are simply examples, and the present invention is not limited thereto and can be carried out in appropriately modified manners within the scope of the gist of the present invention. Further, the present invention is not limited only to these examples, and it is possible to add, omit, replace or change the position, number, shape, material, constitution, and the like within the scope not deviating from the gist of the present invention.

[Method of Processing SiC Single Crystal]

The method of processing a SiC single crystal according to the present embodiment includes a measuring step and a surface processing step. In the measuring step, a shape of an atomic arrangement plane of the SiC single crystal is measured along a first direction passing through the center in plan view and a second direction orthogonal to the first direction. In addition, in the surface processing step, a first plane to be an attachment plane of the SiC single crystal is processed. Hereinafter, each step will be specifically described below.

<Measuring Step>

FIG. 1 is a schematic diagram showing an example of a section plane taken along a straight line extending in a first direction passing through a center in a plan view of a SiC single crystal 1. The first direction can be set as any direction. In FIG. 1, the first direction is set as [1-100] direction. In FIG. 1, the upper side is set as a [000-1] direction, that is, a direction in which a carbon face (C-face, (000-1) plane) when cutting perpendicular to the <0001> direction. Hereinafter, a case where the first direction is [1-100] direction will be described as an example.

Here, the crystal orientation and the plane are expressed using the following parentheses as Miller indices. ( ) and { } are used when expressing the plane. ( ) is used to express a specific plane, and { } is used to express a generic name (collective plane) of equivalent planes due to the symmetry of crystals. On the other hand, < > and [ ] are used in particular to express a direction. [ ] is used to express a specific direction, and < > is used to express equivalent direction due to symmetry of crystals.

As shown in FIG. 1, the SiC single crystal 1 is a single crystal in which a plurality of atoms A are aligned. Therefore, as shown in FIG. 1, when a section plane of the SiC single crystal is viewed microscopically, an atomic arrangement plane 2 in which a plurality of atoms A are arranged is formed. The atomic arrangement plane 2 on the section plane is expressed as a line extending in a direction substantially parallel to the cutting direction obtained by connecting atoms A arranged along the section plane. In a case where atomic arrangement plane 2 is not flat, as shown in FIG. 1, the atomic arrangement plane 2 is curved with an amount of curvature d1.

Figure 2:
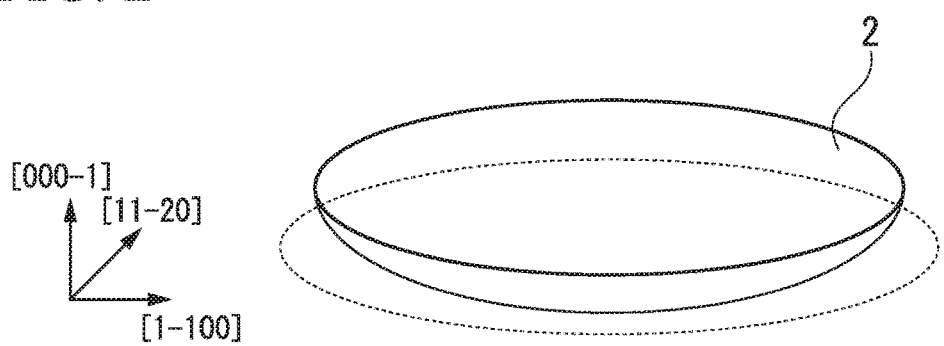
FIG. 2 is a schematic diagram showing an example of an atomic arrangement plane of the SiC single crystal.
Figure 3:
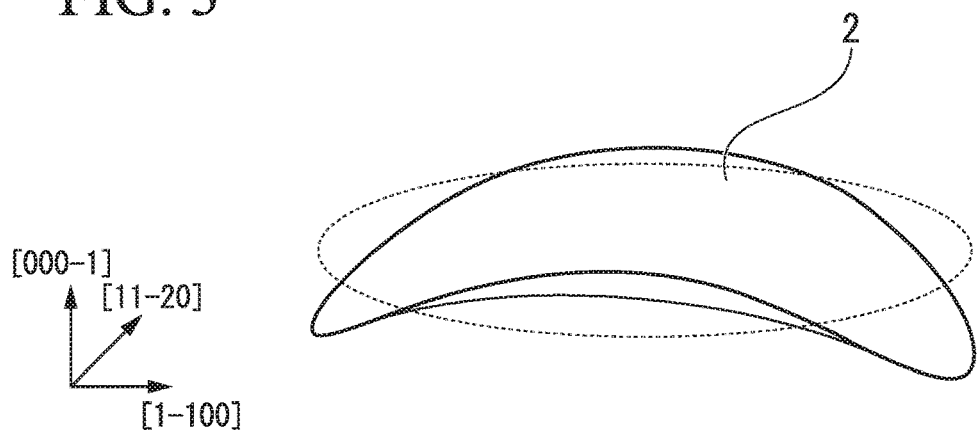
FIG. 3 is a schematic diagram showing another example of an atomic arrangement plane of the SiC single crystal.

The shape of the atomic arrangement plane 2 may be different depending on the direction of the section plane regardless of the shape of the outermost surface of the SiC single crystal 1. FIGS. 2 and 3 are diagrams schematically showing an example of different shapes of the atomic arrangement plane 2. The atomic arrangement plane 2 shown in FIG. 2 is a bowl type having a concave shape at any section plane parallel to a [000-1] direction toward the center. That is, in the atomic arrangement plane 2 shown in FIG. 2, the curving direction does not coincide with in the [1-100] direction and the [11-20] direction orthogonal to the [1-100] direction. On the other hand, the atomic arrangement plane 2 shown in FIG. 3 has a shape of a saddle type (potato chip shape) which is a concave shape in a predetermined section plane and a convex shape in different section planes. Therefore, in the atomic arrangement plane 2 shown in FIG. 3, the curving direction is different in the [1-100] direction and the [11-20] direction orthogonal to the [1-100] direction. Regarding the bowl type, curving directions of the atomic arrangement plane 2 in two directions orthogonal to each other may match with each other, and a dome type having a convex shape toward the center at any section plane parallel to the [000-1] direction is also one of a bowl type.

That is, in order to accurately grasp the shape of the atomic arrangement plane 2, it is necessary to measure the shape of the atomic arrangement plane 2 of the SiC single crystal along at least two directions (the first direction and the second direction) that pass through the center in plan view, and are orthogonal to each other. Further, the crystal structure of the SiC single crystal 1 is hexagonal, and it is preferable to measure the shape of the atomic arrangement plane 2 along six directions symmetrical with respect to the center. If the shape of the atomic arrangement plane 2 is measured along six directions symmetrical with respect to the center, the shape of the atomic arrangement plane 2 can be obtained more precisely.

The shape of the atomic arrangement plane 2 can be measured by X-ray diffraction (XRD). The plane to be measured is determined according to the direction to be measured. Assuming that the measurement direction is [hkil], the measurement plane needs to satisfy the relationship (mh mk mi n). Here, m is an integer of 0 or more, and n is a natural number. For example, in a case of measuring in the [11-20] direction, as m=0 and as n=4, the (0004) plane is selected, and as m=2 and as n=16, the (22-416) plane and the like are selected. On the other hand, in a case of measuring in the [11-20] direction, as m=0 and as n=4, the (0004) plane is selected, and as m=3 and as n=16, the (3-3016) plane and the like are selected. That is, the measurement plane may be a different plane depending on the measurement direction, and the atomic arrangement plane 2 to be measured may not necessarily be the same plane. By satisfying the above relationship, it is possible to prevent erroneously recognizing lattice curvature in an a-plane or m-plane direction, which has little influence upon crystal growth, as lattice curvature in a c-plane direction. Both of the C-face and the Si-face may be selected for the measurement, but the measurement is performed on the attachment plane (the first plane) to be attached to the pedestal (installation plane) of the crucible.

The X-ray diffraction data is acquired at five points of a center, an end, and a midpoint between the center and the end along a predetermined direction. In a case where the atomic arrangement plane 2 is curved, since the reflection direction of the X-ray changes, the position of a ω angle of the peak of the X-ray diffraction image outputted at the center and the other portion varies. The curving direction of the atomic arrangement plane 2 can be obtained from the positional variation of this diffraction peak. The radius of curvature of the atomic arrangement plane 2 can also be obtained from the positional variation of the diffraction peak and the amount of curvature of the atomic arrangement plane 2 can also be obtained from the radius of curvature of the atomic arrangement plane 2. The shape of the atomic arrangement plane 2 can be obtained from the curving direction and the amount of curvature of the atomic arrangement plane 2.

(Specific Description of the Method of Measuring Shape of Atomic Arrangement Plane (Method 1))

A method of measuring the curving direction and the amount of curvature of the atomic arrangement plane from the measured value of the XRD of the outer peripheral end portion of the sample obtained by slicing the SiC single crystal (hereinafter, referred to as a wafer 20). Although the measuring method will be described using the wafer 20 as an example, it is also possible to measure an ingot-like SiC single crystal before being sliced using a similar method.

Figure 4:
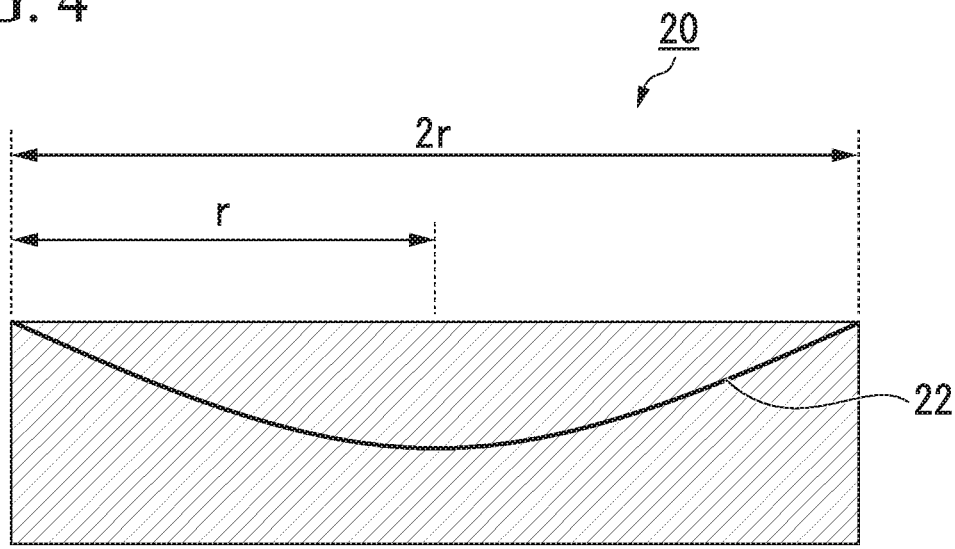
FIG. 4 is a schematic view showing an example of a section plane of the SiC wafer for specifically describing a method of measuring the shape of the atomic arrangement plane.

FIG. 4 schematically shows an example of a section plane passing through the center in plan view and cut along the measurement direction of the atomic arrangement plane, for example, the [1-100] direction. Assuming that the radius of the wafer 20 is r, the lateral length of the cross section is 2r. FIG. 4 also shows the shape of an atomic arrangement plane 22 in the wafer 20. As shown in FIG. 4, although the shape of the wafer 20 itself is flat, the atomic arrangement plane 22 may be curved in some cases. The atomic arrangement plane 22 shown in FIG. 4 is bilaterally symmetrical and curved in a concave shape. This symmetry is attributable to the fact that the manufacturing conditions of the SiC single crystal (ingot) are symmetrical with respect to the center.

Note that, this symmetry does not need to be perfectly symmetric but means symmetry as an approximation that accepts blur due to fluctuations in manufacturing conditions and the like.

Figure 5:
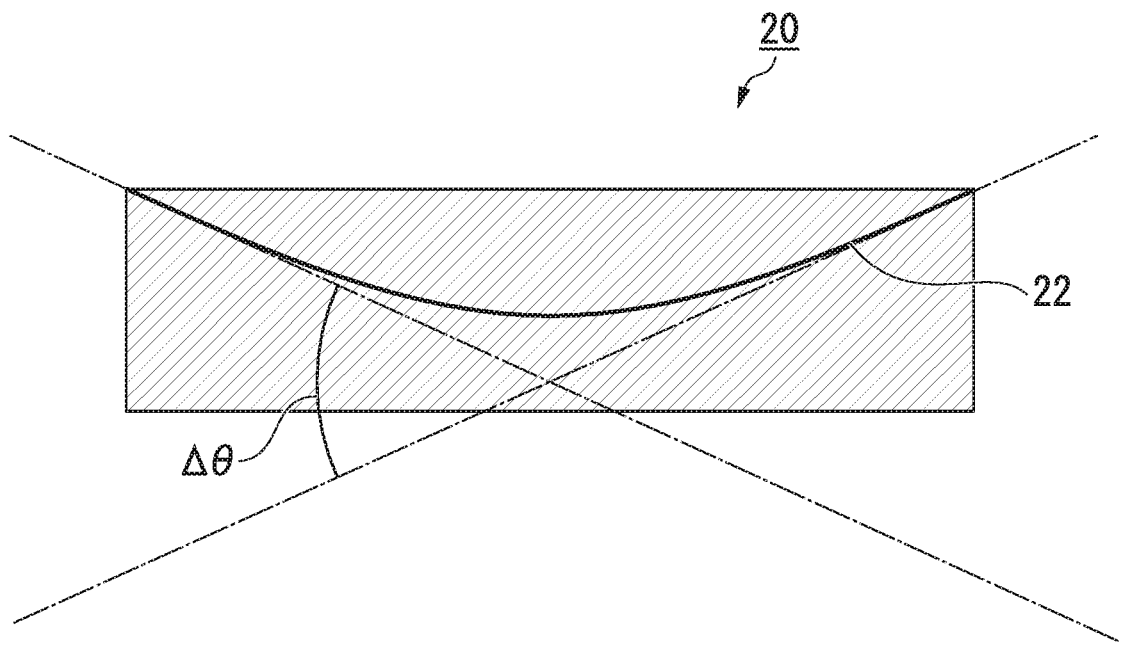
FIG. 5 is a schematic view showing an example of a section plane of the SiC wafer for specifically describing a method of measuring the shape of the atomic arrangement plane.

Next, as shown in FIG. 5, XRD is performed on both outer peripheral ends of the wafer 20, and a difference Δθ of X-ray diffraction peak angle between the measured two points is obtained. This Δθ represents the difference of inclination in the measured two atomic arrangement planes 22. As described above, for the diffraction plane used for the X-ray diffraction measurement, an appropriate plane is selected according to the section plane.

Figure 6:
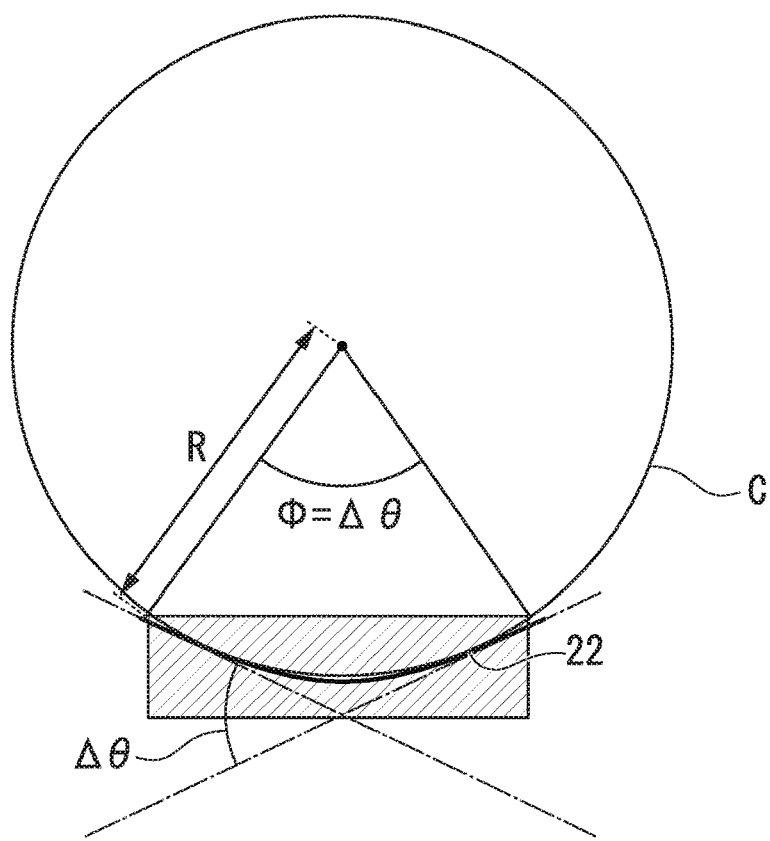
FIG. 6 is a schematic view showing an example of the SiC wafer for specifically describing a method of measuring the shape of the atomic arrangement plane.

Next, as shown in FIG. 6, the radius of curvature of the curved atomic arrangement plane 22 is obtained from the obtained Δθ. In FIG. 6, it is assumed that the curved plane of the atomic arrangement plane 22 of the wafer 20 is a part of a circle, and a circle C which is in contact with the measured two atomic arrangement planes is shown. Geometrically from FIG. 6, a central angle y of the sector including arcs which is perpendicular at both ends is equal to the difference Δθ between the measured X-ray diffraction peak angles. The radius of curvature of the atomic arrangement plane 22 corresponds to a radius R of the arc. The radius R in arc is obtained by the following relational expression.

$$R = \frac{r}{\sin\frac{\Delta\theta}{2}} \quad \text{Expression 1}$$

Figure 7:
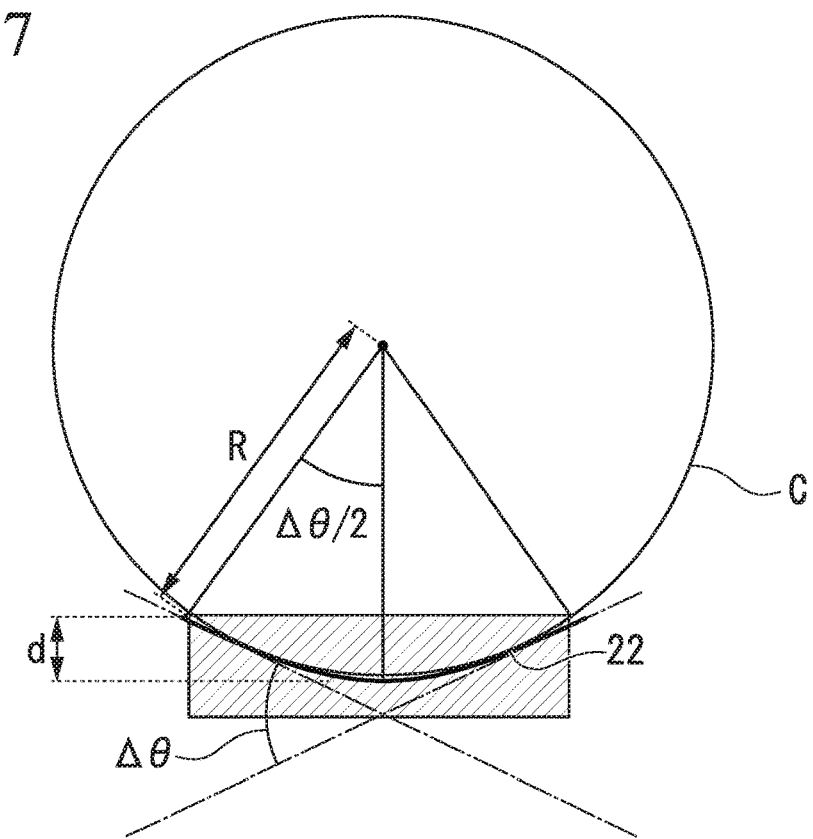
FIG. 7 is a schematic view showing an example of the SiC wafer for specifically describing a method of measuring the shape of the atomic arrangement plane.

From the radius R of the circular arc and the radius r of the wafer 20, the amount of curvature d of the atomic arrangement plane 22 is obtained. As shown in FIG. 7, the amount of curvature d of the atomic arrangement plane 22 corresponds to that obtained by subtracting distance (length) of a perpendicular line drawn from the center of the circular arc to the wafer 20 by the radius of the arc. The distance (length) of the perpendicular line drawn from the center of the circular arc to the wafer 20 is calculated from Pythagorean Theorem and can be obtained by the following relational expression. In this specification, the amount of curvature d in a case where the radius of curvature is positive (concave shape) is defined as a positive value, and the amount of curvature d in a case where the radius of curvature is negative (convex shape) is defined as a negative value.

$$d = |R| - \sqrt{|R^2 - r^2|} \qquad \text{Expression 2}$$

As mentioned above, it is also possible to measure R from only the measured values at both outer ends of wafer 20 of XRD. On the other hand, when this method is used, there is a possibility of misjudging the shape when there is local distortion or the like at the measurement points. Therefore, the X-ray diffraction peak angle is measured at a plurality of points, and the curvature per unit length is converted from the following expression. Although the number of points to be measured can be optionally selected, it may be selected from 2 to 10 times, for example, in a straight line passing through the center of the sample.

$$R = \frac{1}{\sin\left(\frac{1}{2} \cdot \frac{d\theta}{dr}\right)} \qquad \text{Expression 3}$$

Figure 8:
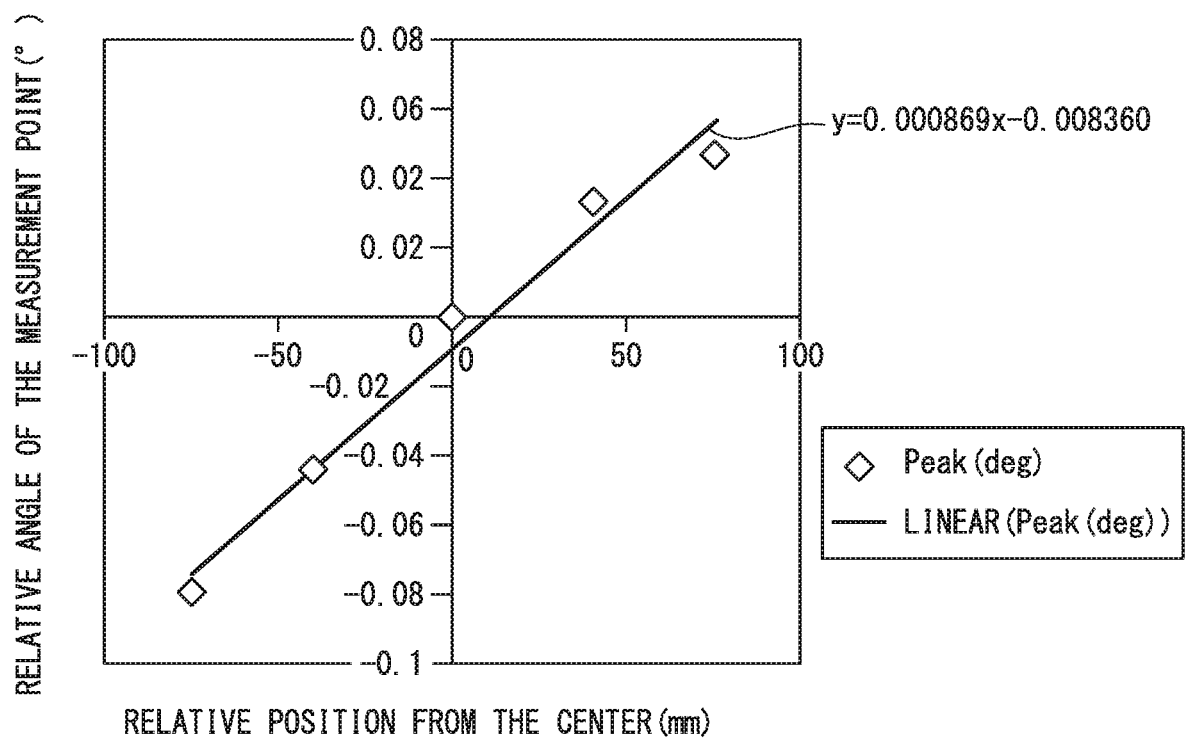
FIG. 8 shows an example in which a radius of curvature of the atomic arrangement plane is obtained from a plurality of XRD measurement points.

FIG. 8 shows an example in which a radius of curvature of the atomic arrangement plane is obtained from a plurality of XRD measurement points. In FIG. 8, a horizontal axis is a relative position from the (wafer) center, and a vertical axis shows a relative diffraction peak angle of each measurement point with respect to a wafer center diffraction peak angle (relative angle of the measurement point). FIG. 8 shows an example in which the [1-100] direction of the wafer is measured and the measurement plane is set to (3-3016). The measurement is performed at five points. The five points are almost linearly aligned, and $d\theta/dr = 8.69 \times 10^{-4}$ deg/mm is obtained from this inclination. By applying this result to the above expression, a concave shape with R=66 m can be calculated. From the radius R and the radius r (75 mm) of the wafer, the amount of curvature d of the atomic arrangement plane is obtained to be 42.6 μm.

Although the example in which the shape of the atomic arrangement plane is concave is described above, a case of the convex shape can be obtained in the same manner. In the case of the convex shape, R is calculated as minus.

(Description of Another Measurement Method (Method 2) of Shape of Atomic Arrangement Plane)

Figure 9:
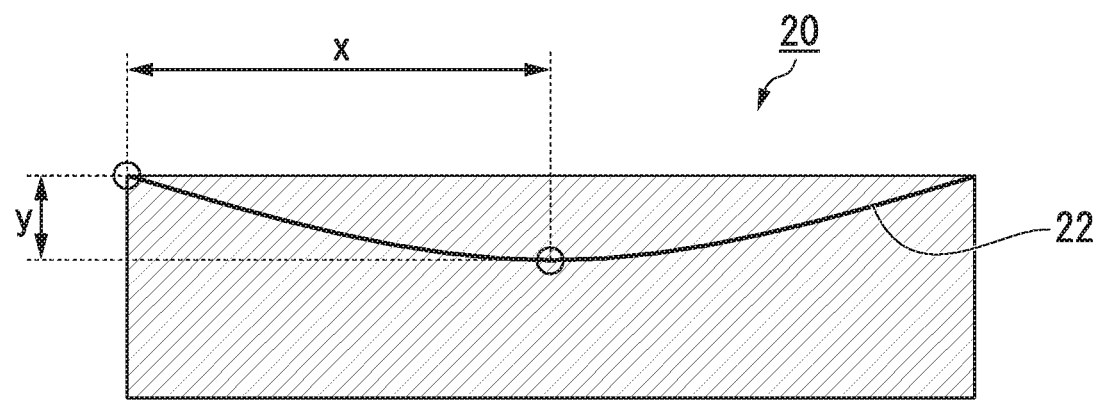
FIG. 9 is a diagram for specifically showing another example of a method of measuring the shape of an atomic arrangement plane.

The shape of the atomic arrangement plane may be obtained by another method. FIG. 9 schematically shows an example of a section plane passing through the center in plan view and cut along the measurement direction of the atomic arrangement plane, for example, the [1-100] direction. In FIG. 9, a case where the shape of the atomic arrangement plane 22 is curved in a concave shape will be described as an example.

Figure 10:
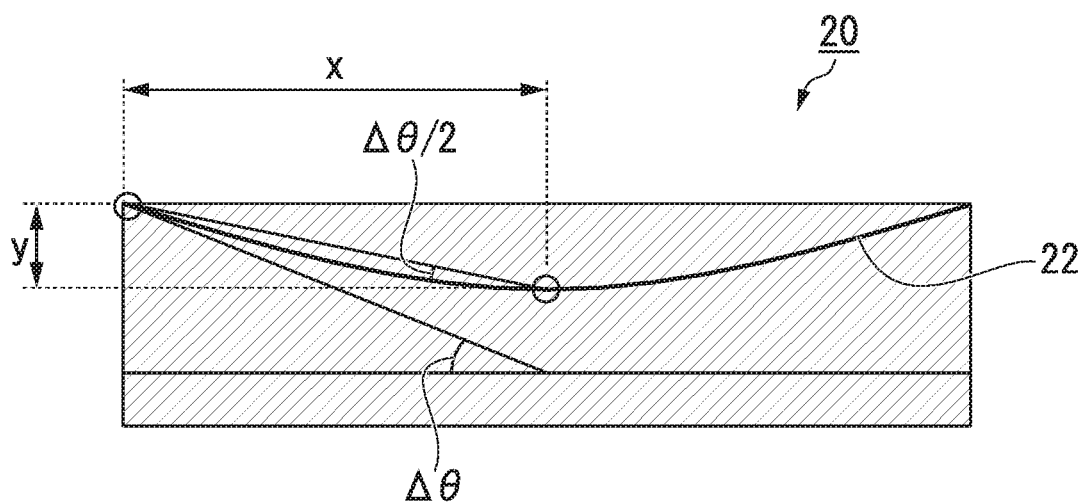
FIG. 10 is a diagram for specifically showing another example of a method of measuring the shape of an atomic arrangement plane.

As shown in FIG. 9, diffraction peaks of X-ray diffraction are measured at two points at a distance x away from the center of the wafer 20 and the center of the wafer 20. From the symmetry of the manufacturing conditions of the ingot, the shape of the wafer 20 can be bilaterally symmetrical as an approximation, and it can be assumed that the atomic arrangement plane 22 becomes flat at the center portion of the wafer 20. Therefore, when the difference in the inclination between the atomic arrangement planes 22 at two points measured as shown in FIG. 10 is set to be Δθ, a relative position y of the atomic arrangement plane 22, that is, a relative depth difference can be expressed in the following expression. Note that, half of the distance between two points is assumed to be x.

$$y = x \tan\left(\frac{\Delta\theta}{2}\right) \qquad \text{Expression 4}$$

By changing the distance x from the center to measure at plurality of points, the relative atom position of the atomic arrangement plane 22 at the wafer center and the measurement point can be obtained at each point.

In this method, the relative positions of atoms on the atomic arrangement plane are obtained at each measurement point. Therefore, the amount of curvature of the local atomic arrangement plane can be obtained. Further, it is possible to show the relative atom position of the atomic arrangement plane 22 in the entire wafer 20, for example, as a graph, which is intuitively useful for grasping the arrangement of the atomic arrangement plane 22.

Here, a case where an object to be measured is the wafer 20 is described as an example. Even in the case where a cut body is a SiC ingot or the object to be measured cut from the SiC ingot, the amount of curvature of the atomic arrangement plane can be obtained in the same manner.

With the above procedure, the amount of curvature of the atomic arrangement plane 2 of the SiC single crystal is measured along at least two directions (the first direction and the second direction) that pass through the center in plan view, and are orthogonal to each other. By obtaining the amount of curvature and the curving direction in each direction, the approximate shape of the atomic arrangement plane 2 as shown in FIGS. 2 and 3 can be obtained.

<Surface Processing Step>

In general, the seed crystal used for single crystal growth is processed considering the surface condition so that the plane to be the growth plane becomes a mirror plane. On the other hand, a back surface (first plane) of the seed crystal on the pedestal side needs to be flattened to such an extent that it can be attached to the pedestal, but the surface state is not limited in general. In the surface processing step, the surface state on the back surface (first plane) side is adjusted. That is, the seed crystal has a first plane which is attached to the pedestal and a second plane where the crystal growth is performed.

In surface processing step, based on the shape of the atomic arrangement plane 2 measured in the measuring step, a grinding step of grinding the attachment plane (first plane) of the SiC single crystal 1. In the grinding step, a difference is given to the surface state between the first plane and the second plane facing the first plane, and the atomic arrangement plane is flattened by Twyman's effect.

When the grinding processing is performed, forces of different sizes act on the SiC single crystal due to Twyman's effect in two directions with different surface roughness (ROUGHNESS OF THE SURFACE) resulting from the processing. Twyman's effect means that when a stress difference occurs between the first plane of the substrate and the second plane facing the first plane, a force acts to compensate for the balance of the stress on the both planes, thereby causing warp of the substrate. If the state of the second plane with respect to the first plane to be ground is constant, a difference in surface roughness leads to the stress difference occurred on both planes of the SiC single crystal. In other words, Twyman's effects of different sizes occur in two directions. In a case of grinding the SiC single crystal in a straight line by horizontal-spindle (peripheral) surface grinder, a processed altered layer having a large stress difference between the spindle axis and the direction (axis) perpendicular to the spindle axis is formed by small cracks generated by grinding. The SiC single crystal is warped in the direction in which the plane having this processed altered layer expands due to Twyman's effect. As a result, the SiC single crystal is deformed. The direction in which a large stress is generated is the direction in which the surface roughness is coarse due to small cracks.

By using this principle, it is possible to flatten the atomic arrangement plane shape of SiC single crystal having various forms of atomic arrangement planes. For example, in a case where the shape of the atomic arrangement plane 2 is a dome type in which the bowl type (FIG. 2) is reversed, it is concentrically ground. The concentric grinding can be performed, for example, by vertical-spindle (wheel-face) grinder. On the other hand, as shown in FIG. 3, in a case where the shape of the atomic arrangement plane 2 is a saddle type (FIG. 3), grinding is performed along a direction with a small amount of curvature, that is, along the third direction. Grinding along a predetermined direction can be realized by horizontal-spindle (peripheral) surface grinder along a predetermined direction.

Figure 11:
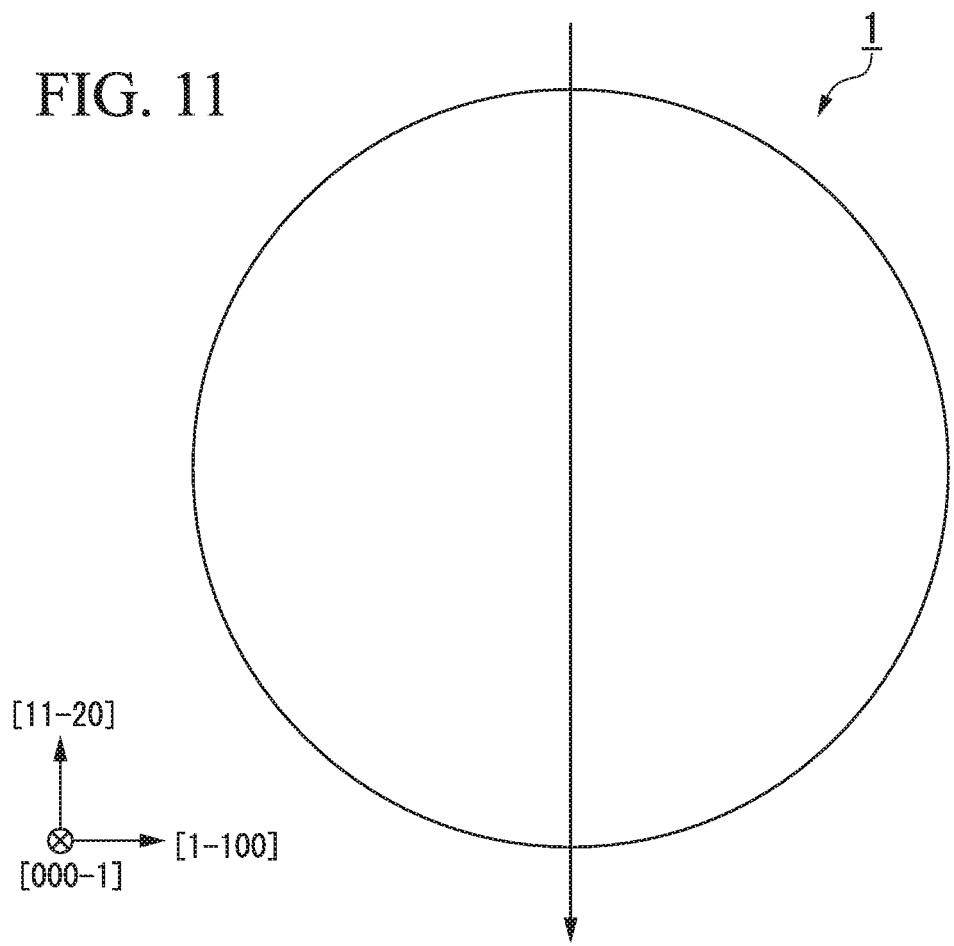
FIG. 11 is a diagram of the SiC single crystal in plan view.

First, a case where the shape of the atomic arrangement plane 2 is a saddle type (FIG. 3) will be specifically described. FIG. 11 is a diagram of the SiC single crystal in plan view. Corresponding to FIG. 3 and FIG. 11, FIG. 11 corresponds to the diagram of the SiC single crystal 1 when viewing FIG. 3 from below. The near side of the paper of FIG. 11 is the back surface (first plane) of the SiC single crystal and is the plane to be ground and the growth plane when the back side of the paper is used as a seed crystal. In the [11-20] direction, the atomic arrangement plane of the SiC single crystal 1 shown in FIG. 11 is curved convexly from the near side of the paper toward the deep side of the page. In the [1-100] direction, the atomic arrangement plane of the SiC single crystal 1 is curved in a concave shape from the left side of the paper to the right side of the page. The amount of curvature of the atomic arrangement plane in the [1-100] direction is assumed to be larger than the amount of curvature of the atomic arrangement plane in the [11-20] direction.

In order to bring the atomic arrangement plane 2 close to flat, the processing for reducing the amount of curvature in the [1-100] direction is performed. As indicated by an arrow in FIG. 11, the entire first plane of the SiC single crystal was linear, that is, straightly ground by horizontal-spindle (peripheral) surface grinder along the [11-20] direction having a smaller amount of curvature compared to the [1-100]. With this processing, the [1-100] direction orthogonal to [11-20] in which the wafer is ground can be deformed to a direction where the amount of concave curvature is small. Here, "along the [11-20] direction" means to be "substantially parallel to the [11-20] direction" and it does not need to be perfectly parallel. For example, an inclination of about 20° with respect to the [11-20] direction is allowable.

Figure 12A:
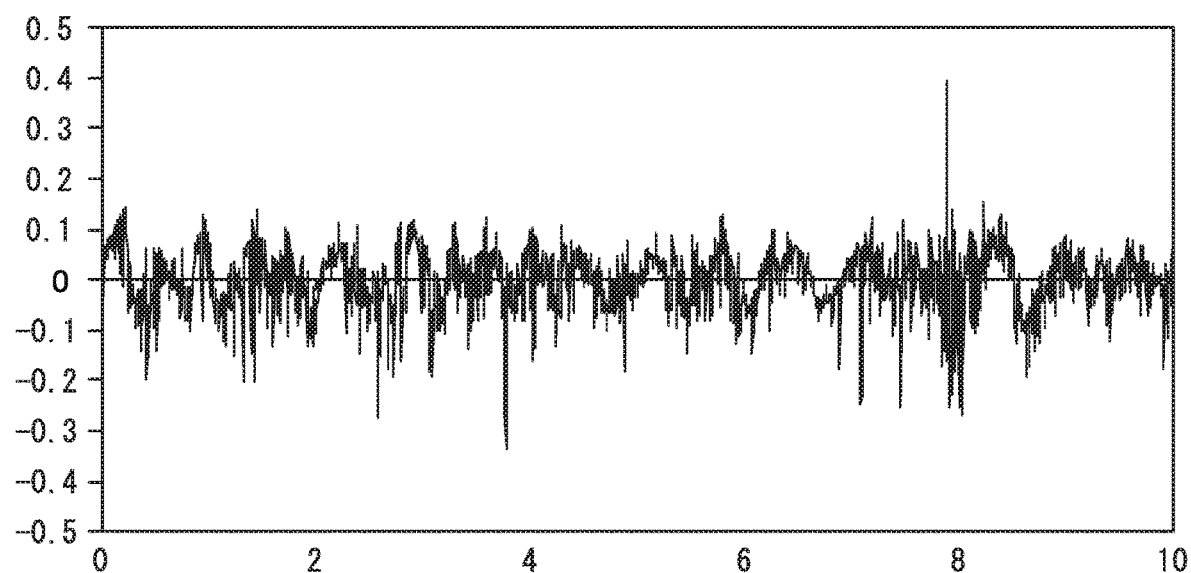
FIG. 12A is a result of measuring the surface roughness of a first plane of the SiC single crystal after surface processing.
Figure 12B:
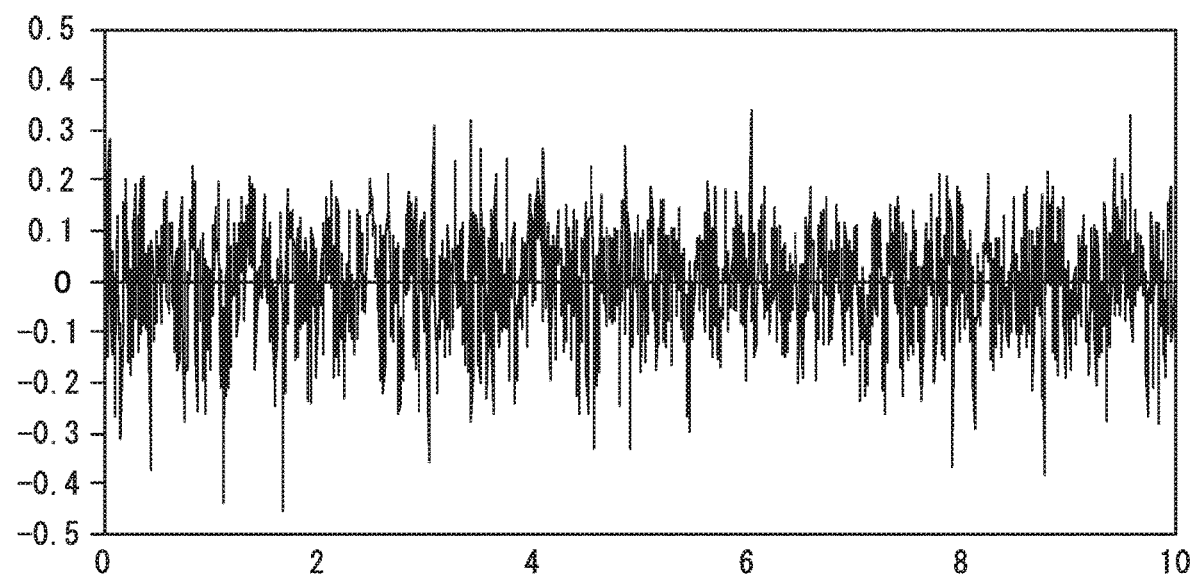
FIG. 12B is a result of measuring the surface roughness of a first plane of the SiC single crystal after surface processing.

FIGS. 12A and 12B are the results of measuring the surface roughness of the first plane of the SiC single crystal after the surface processing as described above. FIG. 12A is a result of measurement of the first plane of the SiC single crystal ground in a straight line by horizontal-spindle (peripheral) surface grinder along the [11-20] direction. FIG. 12B is a result of measurement along the [1-100] direction orthogonal to the spindle axis. The surface roughness in the [11-20] direction as shown in FIG. 12A was Ra=0.04 μm. In contrast, the surface roughness in the [1-100] direction as shown in FIG. 12B was Ra=0.08 μm. That is, the surface roughness in the [1-100] direction orthogonal to the spindle axis is larger (rougher) than the surface roughness in the [11-20] direction.

Figure 13:
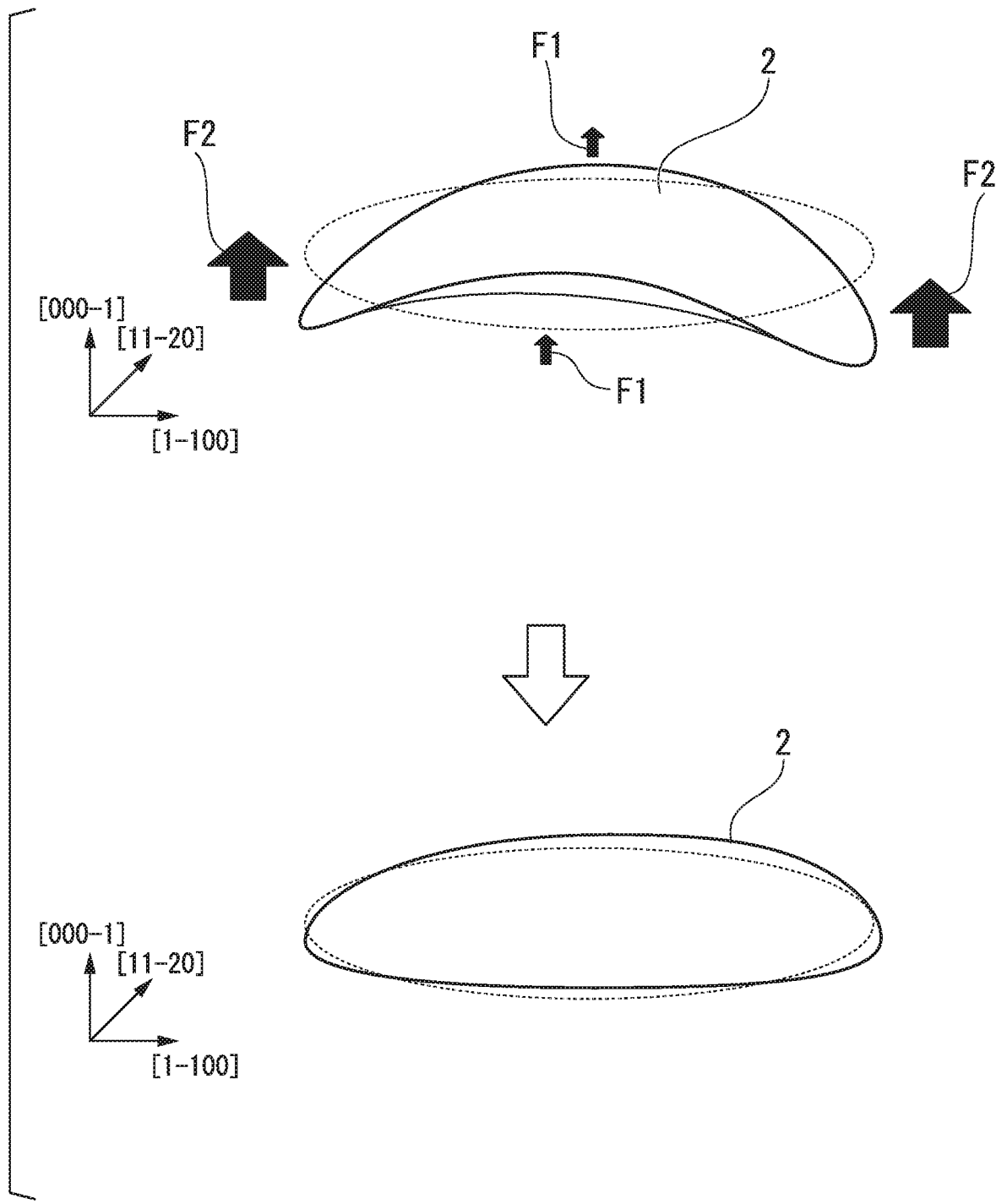
FIG. 13 is a diagram showing a state in which the atomic arrangement plane of the SiC single crystal is flattened by Twyman's effect.

In a case of the SiC single crystal having the surface state as shown in FIGS. 12A and 12B, the direction orthogonal to the rough spindle axis of the surface roughness affected by a great Twyman's effect as compared with the spindle axis and thereby a large warp occurs. That is, the SiC single crystal 1 is warped in a direction orthogonal to the spindle axis and hardly warped along the spindle axis. At this time, the direction in which the SiC single crystal is warped is adjusted so as to be different from the curving direction which is the largest curved. As a result, the SiC single crystal 1 is warped in the direction opposite to the atomic arrangement plane 2, and thereby the force F1 acts in a direction in which the curvature of the atomic arrangement plane 2 in the direction orthogonal to the grinding is eliminated as shown in FIG. 13. As a result, the atomic arrangement plane 2 in the direction orthogonal to the spindle axis is flattened. On the other hand, the warp of the SiC single crystal 1 along the spindle axis is small. Therefore, a force F2 acting on the atomic arrangement plane 2 along the spindle axis is small, and the amount of curvature of the atomic arrangement plane 2 does not change greatly. As a result, as shown in FIG. 13, the shape of the atomic arrangement plane 2 is flattened as a whole.

In the method of processing the SiC single crystal according to the present embodiment, the atomic arrangement plane 2 is flattened not by crystal orientation but by the direction of stress generated by processing. Therefore, it is not limited to a specific plane orientation or polymorph of 4H, it can also be applied to the growth of 6H using a Si plane as the growth plane and the single crystal growth using the seed crystal having the special off angle.

Next, a case where the shape of the atomic arrangement plane 2 is a bowl type will be described. Similar to the case of the saddle type in FIG. 3, when the SiC single crystal is viewed from below, in a case where the shape of the atomic arrangement plane is convexly curved (dome type: structure opposite to FIG. 2) such that the center of the atomic arrangement plane 2 protrudes from the outer peripheral end, the atomic arrangement plane 2 can be flattened.

In this case, in the surface processing method, it is possible to deform the SiC single crystal in the direction in which the curvature of the atomic arrangement plane 2 becomes smaller by grinding the attachment plane (first plane) of the SiC single crystal 1. For example, in a case where the atomic arrangement plane 2 has a convex shape but is gentle (in a case where the measurement result of FIG. 8 is approximated to a straight line), the first plane may be entirely ground as a whole. If there is a difference in roughness between the front and back (the first plane and the second plane) of the SiC single crystal, it is possible to flatten the atomic arrangement plane on the second plane side by correcting the shape of the atomic arrangement plane as a whole in the opposite direction.

In addition, when the atomic arrangement plane 2 is amorphous and the warp of the center is large (in a case where the measurement result of FIG. 8 does not become a straight line), the first plane can be concentrically ground with different conditions. By such grinding, it is possible to flatten the shape of the atomic arrangement plane 2 while maintaining rotational symmetry. When the grinding is performed concentrically, the surface roughness on the outer circumferential end side of the first plane may be ground so as to be rougher than the surface roughness of the central portion. Also, depending on the shape of the warp, only a part of the specific radius may be ground. As described above, a rough surface (a portion having a rough surface roughness) is greatly affected by Twyman's effect, and a portion having a low surface roughness is less affected by Twyman's effect. As a result, the warp amount of the center of the SiC single crystal having a reduced surface roughness is small, and the warp amount on the outer peripheral side where the surface roughness is roughened can be increased. The shape of the atomic arrangement plane 2 of the SiC single crystal 1 can be flattened by setting the direction of the SiC single crystal warp in a direction opposite to the curving direction of the atomic arrangement plane 2 of the SiC single crystal 1. The concentric grinding can be performed, for example, by vertical-spindle (wheel-face) grinder, in which the SiC single crystal is rotated about the center of the SiC single crystal as an axis.

Lastly, a case where the shape of the atomic arrangement plane 2 is locally distorted largely will be described. In a case where the crystal has a small angle grain boundary, a crystal lattice plane curves indefinitely in some cases. In a case where the amount of curvature (degree of curvature) of the lattice plane varies via the grain boundary, in the graph (the relative position from the center of the wafer and the relative diffraction peak angle of each measurement point) shown in FIG. 8, two types of approximate straight lines with different slopes can be obtained via the grain boundary. That is, the position and the degree of the inclination of the atomic arrangement plane 2 of the measured SiC single crystal can be known. Based on the measurement result, when changing the grit number used for grinding for each portion to be ground, it is possible to control the stress difference on both sides of the SiC single crystal and to control the warp amount of the SiC single crystal 1. In other words, the surface to be the first plane in the SiC single crystal 1 is selected. Thereafter, a portion where the inclination of the approximate straight line shown in FIG. 8 is large is ground with a coarse abrasive which grit number is small because the correction amount of the atomic arrangement plane 2 by surface processing needs to be increased. The larger grit number, the smaller abrasive particle becomes. On the other hand, a portion where the inclination of the approximate straight line shown in FIG. 8 is small is ground with an abrasive which grit number is large because the correction amount of the atomic arrangement plane 2 by the surface processing may be small. As a result, the curvature of the atomic arrangement plane 2 can be locally corrected by changing the grit number of the abrasive in accordance with the shape of the atomic arrangement of the ground portion.

Further, the surface processing step may include a warp amount adjusting step of adjusting the warp amount of the SiC single crystal. As described above, when the warp amount of the SiC single crystal and the curvature amount of the atomic arrangement plane of the SiC single crystal cancel each other, the atomic arrangement plane of the SiC single crystal is flattened. In other words, if the warp amount of the SiC single crystal can be finely adjusted, the atomic arrangement plane can be more easily flattened.

In the warp amount adjusting step, the warp amount of the SiC single crystal can be adjusted by the thickness of the SiC single crystal or the grit number used at the time of grinding.

Figure 14:
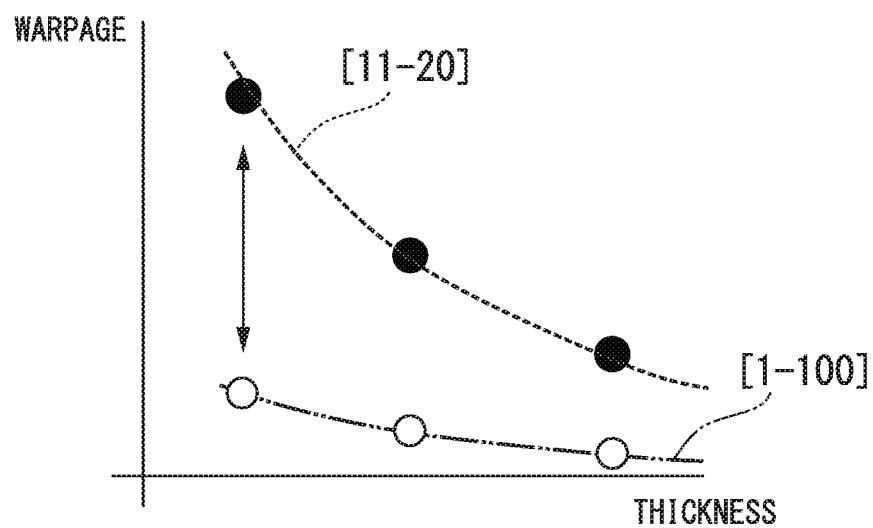
FIG. 14 is a diagram schematically showing a relationship between a thickness of the SiC single crystal and an amount of curvature of the SiC single crystal.

FIG. 14 is a diagram schematically showing a relationship between a thickness of the SiC single crystal (THICKNESS) and an amount of curvature of the SiC single crystal (WARPAGE). When the thickness of the SiC single crystal becomes thick, the SiC single crystal becomes rigid, and thereby the warp amount becomes small. Also, the thinner the SiC single crystal, the higher the sensitivity when affected by Twyman's effect. Therefore, the thinner the thickness of the SiC single crystal, the larger the difference in warp amount between the third direction having a smaller amount of curvature and the other direction. In order to sufficiently curve the SiC single crystal by Twyman's effect, the thickness of the SiC single crystal is preferably 5 mm or less, and more preferably 3 mm or less. In FIG. 14, in accordance with the above example, the third direction having a small amount of curvature is indicated as the [11-20] direction, and the other direction is shown as [1-100].

Figure 15:
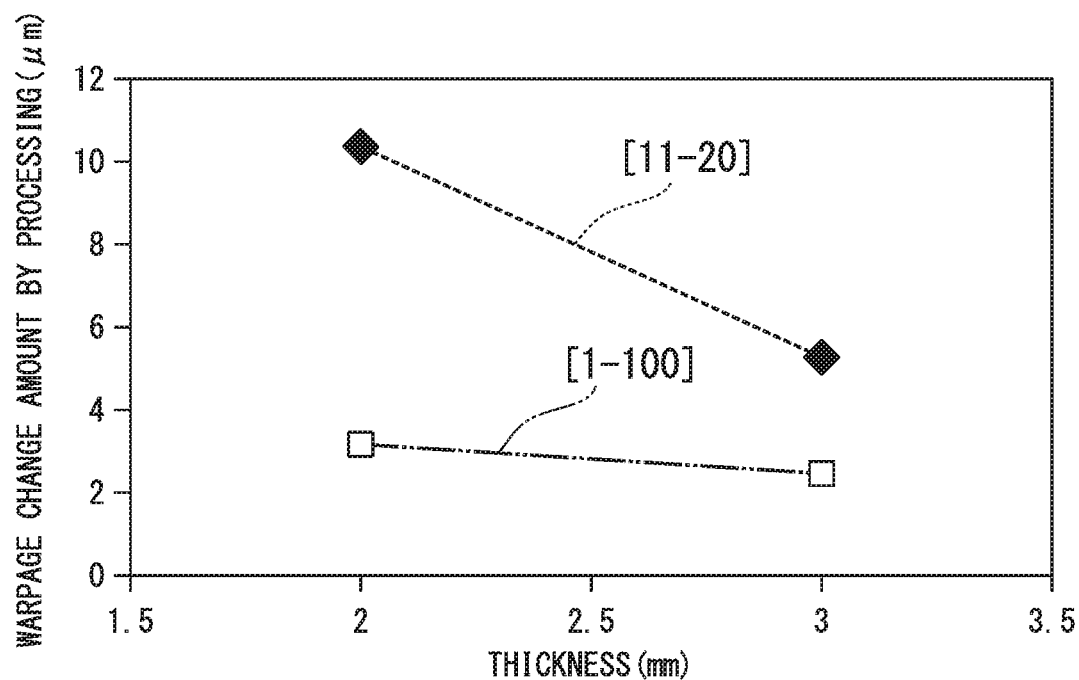
FIG. 15 is a result of actually examining a difference in warp amount of the SiC single crystal by changing the thickness of the SiC single crystal.

FIG. 15 is a result of actually examining a difference in warp amount of the SiC single crystal (WARPAGE AMOUNT BY PROCESSING) by changing the thickness of the SiC single crystal (THICKNESS). When the SiC single crystal having a diameter of 6 inches and a thickness of 2 mm was ground along the [11-20] direction, the amount of curvature in the [11-20] direction was 10.3 μm and the amount of curvature in the [1-100] direction was 5.3 μm. When the thickness of the SiC single crystal was 3 mm, the amount of curvature in the [11-20] direction was 3.2 μm and the amount of curvature in the [1-100] direction was 2.5 μm.

Figure 16:
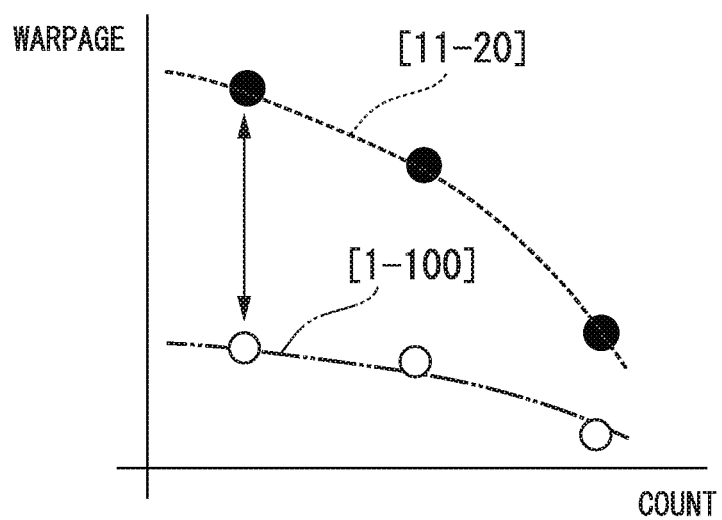
FIG. 16 is a diagram schematically showing a relationship between a grit number and an amount of curvature of the SiC single crystal.

Further, FIG. 16 is a diagram schematically showing a relationship between grit number of the abrasive (COUNT) and an amount of curvature of the SiC single crystal (WARPAGE). As the grit number of the abrasive used for grinding becomes larger, that is, as the abrasive particles become finer, the stress difference between surfaces of the SiC single crystal becomes smaller and the warp amount becomes smaller. Also, as the grit number of the abrasive used for grinding becomes lower, the force generated by Twyman's effect becomes larger, and the difference in the warp amount between the third direction having a smaller amount of curvature and the other directions is increased. In order to sufficiently curve the SiC single crystal by Twyman's effect, the grit number is preferably #800 or lower, and more preferably #600 or lower. Also in FIG. 16, in accordance with the above example, the third direction having a small amount of curvature is set as the [11-20] direction, and the other direction is indicated as [1-100].

That is, when a relationship between the thickness of SiC single crystal and the warp amount of SiC single crystal, and a relationship between the grit number of abrasives used for grinding of SiC single crystal and the warp amount of SiC single crystal are confirmed in advance, the warp amount of the SiC single crystal can be easily set within an appropriate range according to the degree of the amount of curvature of the atomic arrangement plane confirmed in the measuring step.

According to the method of processing a SiC single crystal according to the present embodiment, by changing the warping direction of the SiC single crystal to the direction opposite to the curving direction of the SiC single crystal and changing the processing conditions of the SiC single crystal, it is possible to alleviate the difference in the amount of curvature for each in-plane direction. As a result, it is possible to flatten the atomic arrangement plane of the SiC single crystal.

Here, the radius of curvature of the atomic arrangement plane 2 of the SiC single crystal 1 processed in the surface processing step is 28 m or more, preferably 56 m or more. In a case where the diameter of the SiC single crystal is 150 mm or more, the maximum value of the amount of curvature of the atomic arrangement plane is preferably 100 μm or less, and more preferably 50 μm or less. When the radius of curvature is small, and the amount of curvature of the atomic arrangement plane 2 is large, in order to flatten the atomic arrangement plane 2, the SiC single crystal 1 needs to be greatly warped in the direction opposite to the curving direction of the atomic arrangement plane 2. By setting the warp amount of the SiC single crystal 1 to be within a predetermined range, cracking in the SiC single crystal 1 and stress accumulation in the SiC single crystal 1 can be suppressed.

[Method of Manufacturing SiC Ingot]

In the method of manufacturing the SiC ingot according to the present embodiment, the crystal growth is performed using a SiC single crystal processed by the above-described method of processing a SiC single crystal as a seed crystal. The SiC ingot can be manufactured, for example, by using a sublimation method. The sublimation method is a method of recrystallizing a raw material gas generated by heating a raw material on a single crystal (seed crystal) to obtain a large single crystal (ingot).

Figure 17:
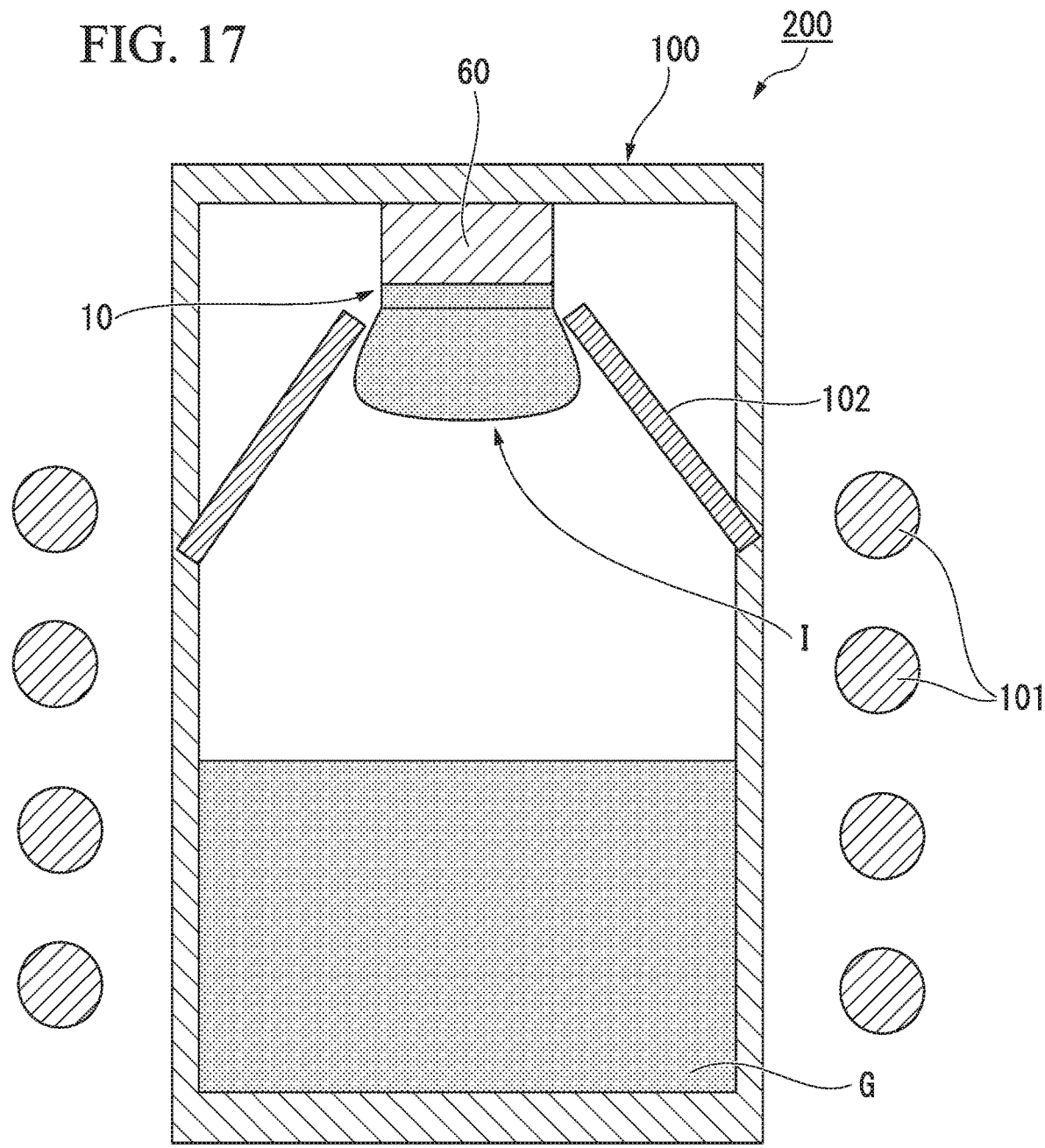
FIG. 17 is a schematic view of an example of a manufacturing apparatus used in a sublimation method.

FIG. 17 is a schematic view of an example of a manufacturing apparatus used in a sublimation method. A manufacturing apparatus 200 includes a crucible 100 and a coil 101. A heating element (not shown) that generates heat by induction heating of the coil 101 may be provided between the crucible 100 and the coil 101. Inside the crucible 100, a tapered guide 102 which expands from a pedestal 60 toward a raw material G is provided.

The crucible 100 has the pedestal 60 provided at a position facing the raw material G In the pedestal 60, the SiC single crystal 10 having the first plane processed by the above-described method of processing a SiC single crystal is attached as a seed crystal. It is desirable that the second plane of the SiC single crystal, which is the growth plane, is a specular plane on which polishing is performed. It is desirable that the SiC single crystal is not to be deformed at the time of attachment of the SiC single crystal while maintaining the warp caused by the grating surface correction in the processing step.

The coefficient of thermal expansion of the pedestal 60 is preferably close to the coefficient of thermal expansion of the SiC single crystal 10 to be attached. Specifically, a difference in the coefficient of thermal expansion is preferably $0.3 \times 10^{-6}/°C$. or less, and is more preferably $0.15 \times 10^{-6}/°C$. or less. Note that, the coefficient of thermal expansion described here means a coefficient of thermal expansion in a temperature range where the crystal growth is performed using the SiC single crystal 10 as a seed crystal and means a temperature in the vicinity of 2000° C. For example, the coefficient of thermal expansion of graphite can be selected within the range of $4.3 \times 10^{-6}/°C$. to $7.1 \times 10^{-6}/°C$. depending on the processing conditions, the contained material, and the like. Since the difference in the coefficient of thermal expansion between the pedestal 60 and the SiC single crystal 10 is small, it is possible to prevent the SiC single crystal 10 from warping due to the difference in the coefficient of thermal expansion during single crystal growth, and the atomic arrangement plane 2 from being curved.

When an alternating current is applied to the coil 101, the crucible 100 is heated, and a raw material gas is generated from the raw material G. The generated raw material gas is supplied to the SiC single crystal 10 installed on the pedestal 60 along the tapered guide 102. By supplying the raw material gas to the SiC single crystal 10, a SiC ingot 1 is crystal-grown on a main plane of the SiC single crystal 10. The crystal growth plane of the SiC single crystal 10 is preferably a c-plane or a plane provided with an off angle of 10° or lower from the c-plane.

The SiC ingot I takes over much of the crystal information of the SiC single crystal 10. Since the atomic arrangement plane 2 of the SiC single crystal 10 is flattened, occurrence of BPD in the SiC ingot I can be suppressed.

Figure 18:
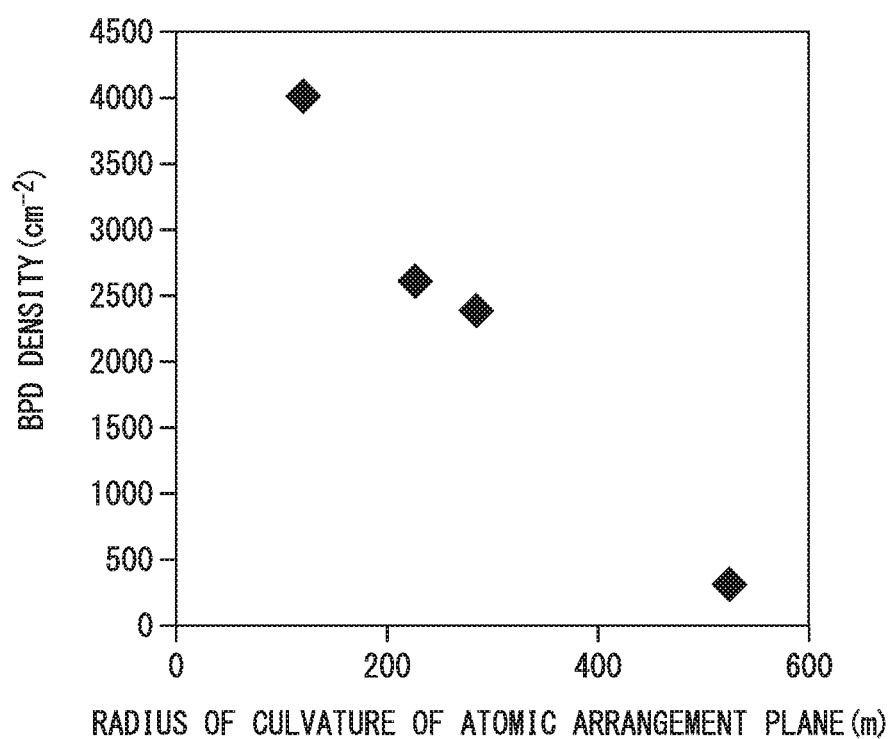
FIG. 18 is a graph showing a relationship between the radius of curvature of the atomic arrangement plane and a BPD density of the SiC single crystal.

FIG. 18 is a graph showing a relationship between the radius of curvature of the atomic arrangement plane and a BPD density of the SiC ingot. As shown in FIG. 18, the radius of curvature of the atomic arrangement plane 2 and the BPD density in the SiC ingot I have a corresponding relationship. As the radius of curvature of the atomic arrangement plane 2 is large (the amount of curvature of the atomic arrangement plane 2 is small), BPD density tends to be decreased. It is considered that the crystal in which the stress remains inside induces slippage on the crystal plane and curves the atomic arrangement plane 2 with the occurrence of BPD. It is also considered that the atomic arrangement plane 2 having a large amount of curvature has strain and causes BPD. In either case, the BPD density is decreased as the radius of curvature of the atomic arrangement plane is large (that is, as the amount of curvature of the atomic arrangement plane is small).

As described above, in the method of manufacturing the SiC ingot according to the present embodiment, the atomic arrangement plane 2 of the SiC single crystal 10 used as a seed crystal is flattened, and thus the occurrence of BPD in the SiC ingot I is suppressed. Therefore, a high-quality SiC ingot I with a low BPD density can be obtained.

Finally, obtained SiC ingot I is sliced to manufacture SiC wafers. A wafer having a plane cut in a direction perpendicular to <0001> or at an off angle of 0° to 10°, parallel to the c-plane, or at an off angle of 0° to 10° from the c-plane is manufactured. For the plane processing of the wafer, mirror surface processing may be applied to the (0001) plane side, that is, the Si plane side. The Si plane is a plane on which epitaxial growth is normally performed. Since the SiC ingot I has less BPD, the SiC wafer having less BPD can be obtained. By using the SiC wafer with fewer BPDs as killer defects, a SiC epitaxial wafer with high quality can be obtained and the yield of the SiC device can be increased.

Further, when heating the crucible 100 to sublimate the raw material G, it is preferable to rotate the crucible 100 so as not to generate circumferential anisotropy. The rotational speed is preferably 0.1 rpm or higher. It is also preferable to reduce the temperature change in the growth plane during growth.

While preferred embodiments of the invention have been described and shown above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

INDUSTRIAL APPLICABILITY

In the method for processing a SiC single crystal according to the present invention, a first plane serving as an attachment plane of the SiC single crystal is subjected to surface processing, and a processing distortion is given to the SiC single crystal, and thereby it is possible to distort the SiC single crystal in a direction opposite to the curving direction of the atomic arrangement plane and flatten the atomic arrangement plane during crystal growth so as to provide a high quality SiC single crystal.

EXPLANATION OF REFERENCES 1,10 SiC SINGLE CRYSTAL
2,22 ATOMIC ARRANGEMENT PLANE
20 WAFER
60 PEDESTAL
100 CRUCIBLE
101 COIL
102 TAPERED GUIDE
A ATOM
I SiC INGOT
G RAW MATERIAL
F1,F2 FORCE
r RADIUS OF WAFER
Δθ DIFFERENCE OF X-RAY DIFFRACTION PEAK ANGLE BETWEEN MEASURED TWO POINTS
φ CENTRAL ANGLE OF SECTOR INCLUDING ARCS WITH CONTACTS AT BOTH ENDS
C CIRCLE IN CONTACT WITH MEASURED TWO ATOMIC ARRANGEMENT PLANES
d AMOUNT OF CURVATURE OF ATOMIC ARRANGEMENT PLANE
x DISTANCE FROM CENTER OF WAFER
y RELATIVE DISTANCE OF ATOMIC ARRANGEMENT PLANE

What is claimed is:

1. A method of processing a SiC single crystal, comprising:
    a measuring step of measuring a shape of an atomic arrangement plane of a SiC single crystal having a first plane and a second plane along at least a first direction passing through a center in plan view and a second direction orthogonal to the first direction; and
    a surface processing step of processing the first plane serving as an attachment plane of the SiC single crystal,
    wherein the surface processing step includes a grinding step of grinding the first plane, and
    wherein in the grinding step, a difference is given to a surface state between the first plane and the second plane facing the first plane, and the atomic arrangement plane is flattened by Twyman's effect.

2. The method of processing a SiC single crystal according to claim 1,
    wherein in the grinding step, in a case where the shape of the atomic arrangement plane is a saddle type, the first plane is ground along a direction in which an amount of curvature of the atomic arrangement plane is small, and
    wherein in a case where the shape of the atomic arrangement plane is a bowl type, the first plane is concentrically ground.

3. The method of processing a SiC single crystal according to claim 1,
    wherein the surface processing step includes a warp amount adjusting step of adjusting a warp amount of the SiC single crystal, and
    wherein in the warp amount adjusting step, a thickness of the SiC single crystal is set, to adjust the warp amount of the SiC single crystal.

4. The method of processing a SiC single crystal according to claim 2,
    wherein the surface processing step includes a warp amount adjusting step of adjusting a warp amount of the SiC single crystal, and
    wherein in the warp amount adjusting step, a thickness of the SiC single crystal is set, to adjust the warp amount of the SiC single crystal.

5. The method of processing a SiC single crystal according to claim 1,
    wherein the surface processing step includes a warp amount adjusting step of adjusting a warp amount of the SiC single crystal, and
    wherein in the warp amount adjusting step, a grit number used for grinding of SiC single crystal is selected, to adjust the warp amount of the SiC single crystal.

6. The method of processing a SiC single crystal according to claim 2,
    wherein the surface processing step includes a warp amount adjusting step of adjusting a warp amount of the SiC single crystal, and
    wherein in the warp amount adjusting step, a grit number used for grinding of SiC single crystal is selected, to adjust the warp amount of the SiC single crystal.

7. The method of processing a SiC single crystal according to claim 3,
    wherein the surface processing step includes a warp amount adjusting step of adjusting a warp amount of the SiC single crystal, and
    wherein in the warp amount adjusting step, a grit number used for grinding of SiC single crystal is selected, to adjust the warp amount of the SiC single crystal.

8. The method of processing a SiC single crystal according to claim 1,
    wherein a radius of curvature of the atomic arrangement plane of the SiC single crystal processed in the surface processing step is 28 m or more, or a maximum value of an amount of curvature is 100 μm or less.

9. The method of processing a SiC single crystal according to claim 2,
    wherein a radius of curvature of the atomic arrangement plane of the SiC single crystal processed in the surface processing step is 28 m or more, or a maximum value of the amount of the curvature is 100 μm or less.

10. The method of processing a SiC single crystal according to claim 3,
    wherein a radius of curvature of the atomic arrangement plane of the SiC single crystal processed in the surface processing step is 28 m or more, or a maximum value of an amount of curvature is 100 μm or less.

11. The method of processing a SiC single crystal according to claim 4,
    wherein a radius of curvature of the atomic arrangement plane of the SiC single crystal processed in the surface processing step is 28 m or more, or a maximum value of an amount of curvature is 100 μm or less.

12. A method of manufacturing a SiC ingot using a SiC single crystal processed by the method of processing a SiC single crystal according to claim 1 as a seed crystal, the method comprising:
    a step of attaching the first plane of the SiC single crystal as an attachment plane to a pedestal; and
    a crystal growth step of performing crystal growth on the SiC single crystal attached to the pedestal as the seed crystal.

13. A method of manufacturing a SiC ingot using a SiC single crystal processed by the method of processing a SiC single crystal according to claim 2 as a seed crystal, the method comprising:

a step of attaching the first plane of the SiC single crystal as an attachment plane to a pedestal; and a crystal growth step of performing crystal growth on the SiC single crystal attached to the pedestal as the seed crystal.

14. A method of manufacturing a SiC ingot using a SiC single crystal processed by the method of processing a SiC single crystal according to claim 3 as a seed crystal, the method comprising:

a step of attaching the first plane as an attachment plane of the SiC single crystal to a pedestal; and a crystal growth step of performing crystal growth on the SiC single crystal attached to the pedestal as the seed crystal.

15. A method of manufacturing a SiC ingot using a SiC single crystal processed by the method of processing a SiC single crystal according to claim 4 as a seed crystal, the method comprising:

a step of attaching the first plane as an attachment plane of the SiC single crystal to a pedestal; and a crystal growth step of performing crystal growth on the SiC single crystal attached to the pedestal as the seed crystal.

16. A method of manufacturing a SiC ingot using a SiC single crystal processed by the method of processing a SiC single crystal according to claim 5 as a seed crystal, the method comprising:

a step of attaching the first plane of the SiC single crystal to a pedestal as an attachment plane; and a crystal growth step of performing crystal growth on the SiC single crystal attached to the pedestal as the seed crystal.

17. The method of manufacturing a SiC ingot according to claim 12, wherein a difference in a coefficient of thermal expansion between the pedestal and the SiC single crystal at a crystal growth temperature is $0.3 \times 10^{-6}/°$ C. or less.

18. The method of manufacturing a SiC ingot according to claim 13, wherein a difference in a coefficient of thermal expansion between the pedestal and the SiC single crystal at a crystal growth temperature is $0.3 \times 10^{-6}/°$ C. or less.

19. The method of manufacturing a SiC ingot according to claim 14, wherein a difference in a coefficient of thermal expansion between the pedestal and the SiC single crystal at a crystal growth temperature is $0.3 \times 10^{-6}/°$ C. or less.

20. The method of manufacturing a SiC ingot according to claim 15, wherein a difference in a coefficient of thermal expansion between the pedestal and the SiC single crystal at a crystal growth temperature is $0.3 \times 10^{-6}/°$ C. or less.

* * * * *